US007327135B2

(12) United States Patent
Yang

(10) Patent No.: US 7,327,135 B2
(45) Date of Patent: Feb. 5, 2008

(54) TESTING APPARATUS AND TESTING METHOD USING THE SAME

(75) Inventor: Jun-Hua Yang, Shenzhen (CN)

(73) Assignees: Innocom Technology ( Shenzhen) Co., Ltd., Shenzhen, Guangdong Province (CN); Innolux Display Corp., Chu-Nan, Miao-Li County (TW)

( * ) Notice: Subject to any disclaimer, the term of this patent is extended or adjusted under 35 U.S.C. 154(b) by 22 days.

(21) Appl. No.: 11/474,627

(22) Filed: Jun. 26, 2006

(65) Prior Publication Data

US 2006/0290371 A1 Dec. 28, 2006

(30) Foreign Application Priority Data

Jun. 24, 2005 (TW) .............................. 94121215 A

(51) Int. Cl.
*G01R 31/28* (2006.01)

(52) U.S. Cl. .................................................. 324/158.1

(58) Field of Classification Search ............. 324/158.1, 324/770; 345/50
See application file for complete search history.

(56) References Cited

U.S. PATENT DOCUMENTS

| 5,267,173 | A | * | 11/1993 | Tanizawa et al. ........... 700/229 |
| 5,302,891 | A | * | 4/1994 | Wood et al. ................ 324/765 |
| 6,486,927 | B1 | * | 11/2002 | Kim ............................. 349/1 |
| 6,650,548 | B1 | * | 11/2003 | Swetland .................... 361/780 |
| 6,850,087 | B2 | | 2/2005 | Ito |
| 2003/0033895 | A1 | * | 2/2003 | Kitamura ................... 73/865.8 |
| 2004/0186615 | A1 | * | 9/2004 | Wielebski et al. .......... 700/224 |

* cited by examiner

*Primary Examiner*—Ha Tran Nguyen
*Assistant Examiner*—Joshua Benitez
(74) *Attorney, Agent, or Firm*—Wei Te Chung

(57) ABSTRACT

An exemplary testing apparatus (200) for testing electronic device (280) includes a workbench (210), a conveyance board (221) for supporting the electronic device to be tested and a testing device (270). The conveyance board is slidably positioned on the workbench. The testing apparatus further includes an automatic detection device (250), a high voltage connector (241) and an automatic controller (290). The automatic controller receives a signal sent by the automatic detection device and sends an instruction to control the operation of the high voltage connector to connect a plurality of signal channels. The testing apparatus is safe and can reduce the cost.

20 Claims, 3 Drawing Sheets

TESTING APPARATUS AND TESTING METHOD USING THE SAME

FIELD OF THE INVENTION

The present invention relates to a testing apparatus typically used for testing newly manufactured electronic products; and in particular to an automatic testing apparatus that can be used, for example, to test liquid crystal display (LCD) panels.

BACKGROUND

At present, electronic and voltage characteristics of many kinds of newly manufactured electronic appliances need to be tested by a testing apparatus before the electronic appliances are shipped out from the factory. Many electronic appliances such as LCDs are becoming more compact and complicated with each new product release. Therefore testing of the electronic and voltage characteristics by a well-equipped testing apparatus is becoming more and more important. Typical test items include input voltage, output voltage, output current, output loading, output power, output noise, power efficiency, high voltage/high current (also known as hi-pot), short circuits, etc.

Typically, electrical safety standards are established and enforced in various countries in which the electronic appliances are sold and used. The safety standards apply in order to avoid dangers such as electrical shock, electrostatic discharge, heat convection, and electromagnetic radiation. Similarly, many electrical appliances need to pass high voltage testing (also known as hi-pot testing) and insulation resistance testing. Hi-pot testing uses either AC or DC stimulus voltages to test the capability of insulation and the capability of components such as capacitors to withstand high voltages. Examples of hi-pot tests include a high voltage test on phototriacs, a reverse high voltage test on transistors, a leak current test on high voltage capacitors, and an insulation test on insulating material. In another kind of hi-pot test, a fire wire, a ground wire and a neutral wire are subjected to high voltage. It is common for a hi-pot testing apparatus to be implemented in the production line of a factory. The efficiency of testing large numbers of electronic appliances is improved. Further, the results as to the satisfactory condition or otherwise of electronic components of the electronic appliances are apt to be accurate.

Referring to FIG. 3, this illustrates use of a conventional testing apparatus 100. The testing apparatus 100 includes a workbench 110, a plurality of conveyance boards 120, a plurality of actuation devices 130, a plurality of foot-press switches 131, and a test device 140. Each conveyance board 120 is slidably positioned at the workbench 110. LCDs 180 to be tested are supported on the conveyance board 120. The actuation devices 130 are positioned along a middle of the workbench 110. Operators (not shown) can manipulate the actuation devices 130 through corresponding foot-press switches 131. The test device 140 is positioned in the vicinity of the workbench 110, for the convenience of operators. The workbench 110 also includes a pair of test jacks 112. The test device 140 is electrically connected to the test jacks 112 via a connection cable 150.

When the testing apparatus 100 is in use, power cables and signal cables (not labeled) of an LCD 180 to be tested are electrically connected with the test jacks 112 by an operator. This enables the test device 140 to test the LCD 180, and results of the test are displayed on a display screen (not labeled) of the test device 140.

In the illustrated example, two LCDs 180 are supported on each conveyance board 120. When a conveyance board 120 reaches the testing apparatus 100, an operator presses the foot-press switch 131 at the testing apparatus 100. Thereby, the actuation device 130 at the testing apparatus 100 is actuated to stop the conveyance board 120. Then, the operator plugs a power cable plug 182 and a signal cable plug 184 of one of the LCDs 180 into corresponding jacks 1122 and 1124 of the test jacks 112. The test device 140 tests the LCD 180, and a test result is displayed on the display screen of the test device 140. If the test result is a 'pass', the operator unplugs the power cable plug 182 and the signal cable plug 184 of the LCD 180 from the jacks 1122 and 1124. The operator then presses the foot-press switch 131 to deactivate the actuation device 130. Thereby, the conveyance board 120 can move along the workbench 110 to a next test device 140 (not shown).

This use of the testing apparatus 100 needs an operator to connect and disconnect the power cable plug 182 and the signal cable plug 184 of the LCD 180 to and from the test apparatus 100. The high voltage typically used by the testing apparatus 100 presents a danger to the operator. In addition, the manual plugging and unplugging of the power cable plug 182 and the signal cable plug 184 of the LCD 180 is unduly time-consuming and increases costs.

SUMMARY

An exemplary testing apparatus includes a workbench, a conveyance board, and a test device. The conveyance board is slidably positioned on the workbench and configured to support an electronic apparatus to be tested. The test device is configured to test the electronic apparatus. The testing apparatus further includes an automatic detection device, a high voltage connector and an automatic controller. The automatic detection device is used to make sure whether the electronic apparatus exists at the conveyance board. The automatic detection device sends an detection signal if the electronic apparatus exists at he conveyance board. The automatic controller receives the detection signal and sends an instruction to control the high voltage connector and electrically connects a plurality of signal channels.

The testing apparatus includes a current connector which operates in response to the detection signal of the automatic detection device and electrically connects a plurality of signal channels.

An exemplary testing method includes the steps of: positioning the electronic apparatus at the conveyance board and respectively connecting a signal cable and a power cable of the electronic apparatus with a signal cable jack and a power cable jack; moving the conveyance board along long side of the workbench, and sending an detection signal by the automatic detection device and informing the automatic controller when the conveyance board reaches the automatic detection device; actuating the actuation device by the automatic controller to stop the conveyance board; confirming whether the electronic apparatus exists at the conveyance board by the automatic detection device and informing the automatic controller; receiving the detection signal by the automatic controller to respectively connect the current connector and the high voltage connector with a loading output connector and a conductive board, and performing the test when the electronic apparatus passes the signal cable jack and the power cable jack, and disconnecting the current connector and the high voltage connector with the loading output connector and the conductive board when the test is over; and deactivating the actuation device so that the conveyance board moves again.

The automatic controller receives the detection signal issued by the automatic detection device to connect the current connector and the high voltage connector with the loading output connector and the conductive board during the testing process. The high voltage test is performed through a plurality of signal channels so that cost is lowered and the testing apparatus is much more saver.

Other advantages and novel features will become more apparent from the following detailed description of preferred embodiments when taken in conjunction with the accompanying drawings. In the drawings, all the views are schematic, and may show only approximate positions of certain components.

DETAILED DESCRIPTION

The following detailed description is of the best presently contemplated modes of carrying out the invention. This description is not to be taken in a limiting sense, but is made merely for the purpose of illustrating general principles of embodiments of the invention. The scope of the invention is defined by the appended claims and equivalents thereof.

Figure 1:
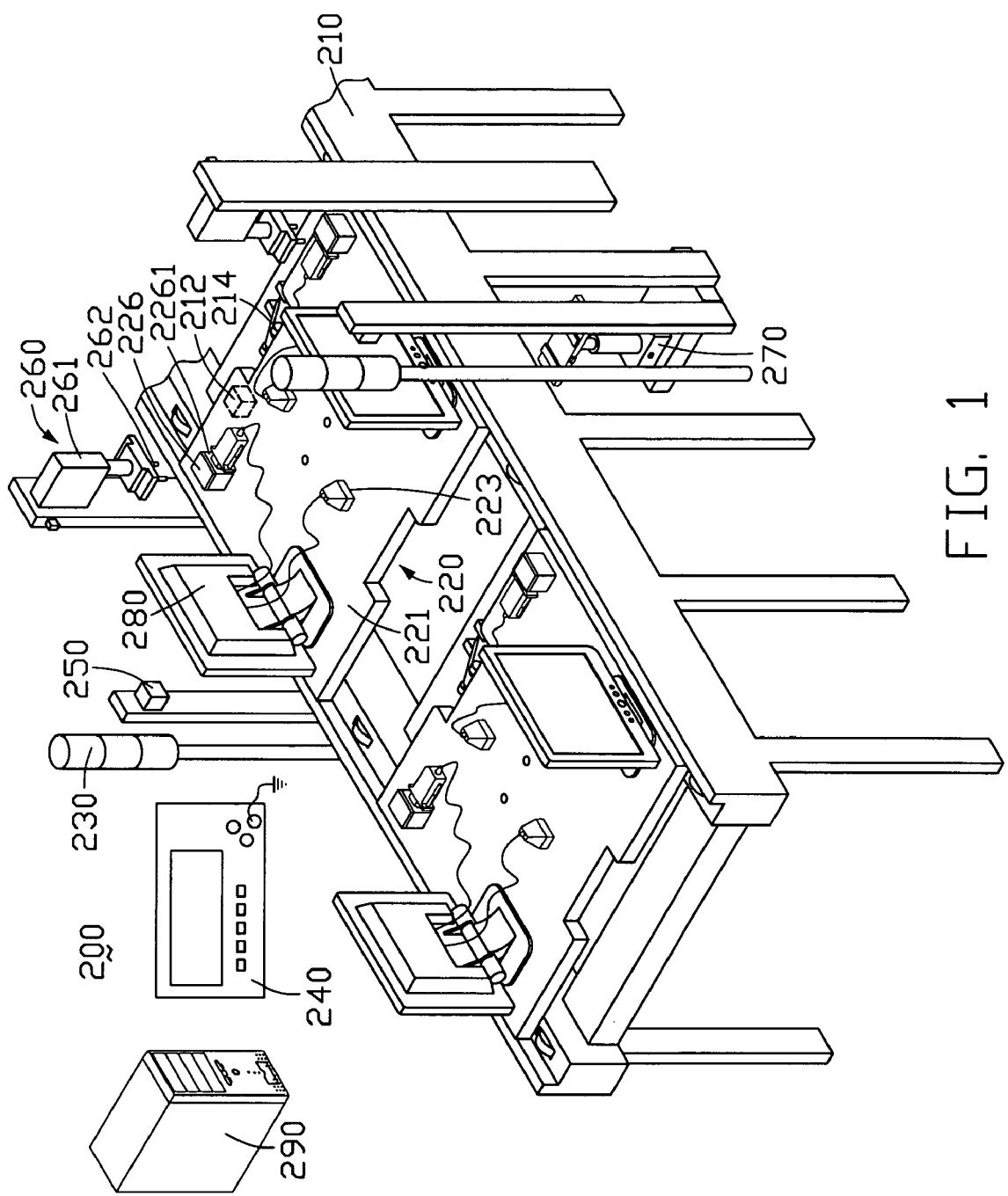
FIG. 1 is an isometric view of part of a testing apparatus in accordance with an exemplary embodiment of the present invention, together with four LCDs positioned thereon.
Figure 2:
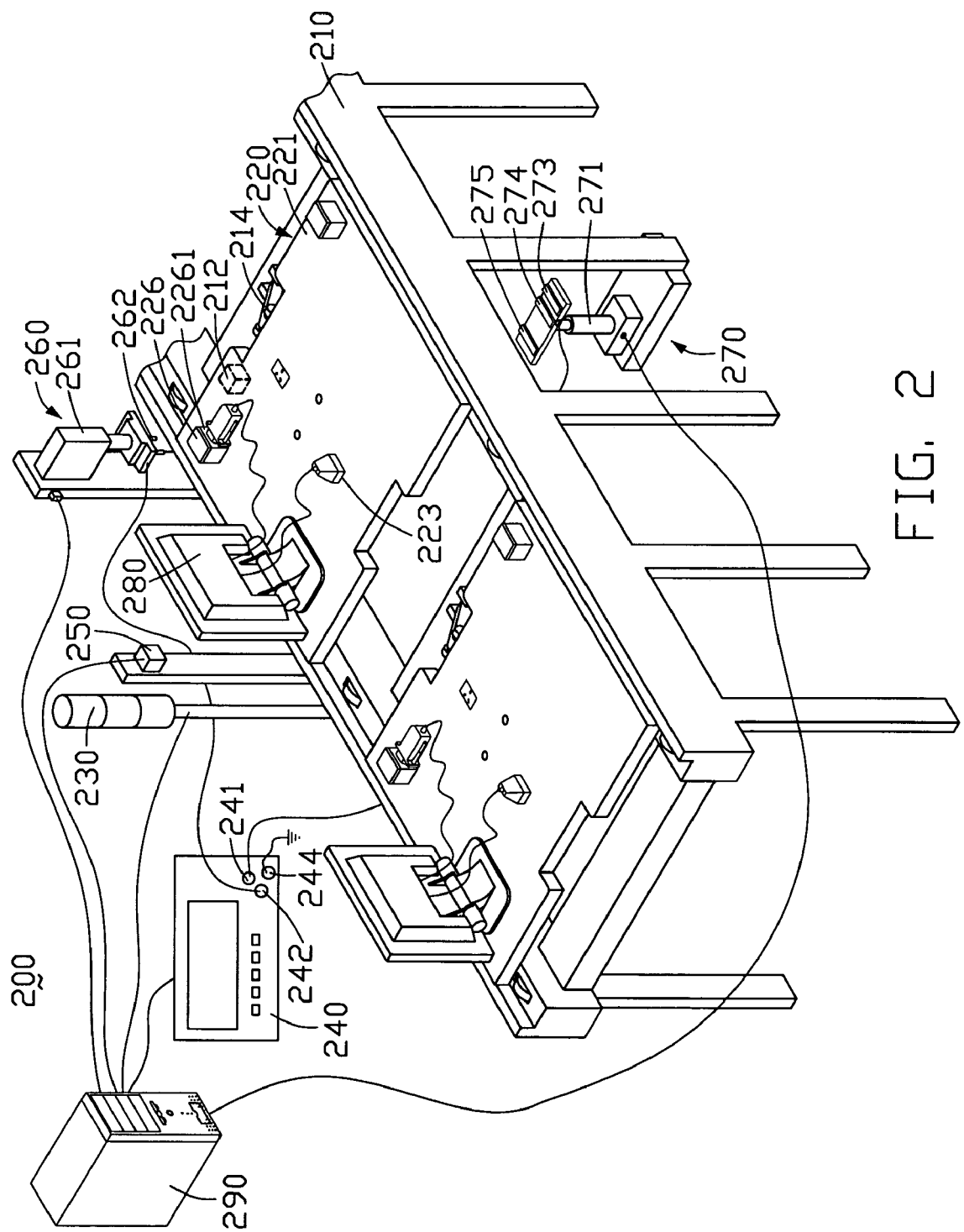
FIG. 2 is similar to FIG. 1, but showing electrical connection relationships among several of components of the testing apparatus, and omitting other components.
Figure 3:
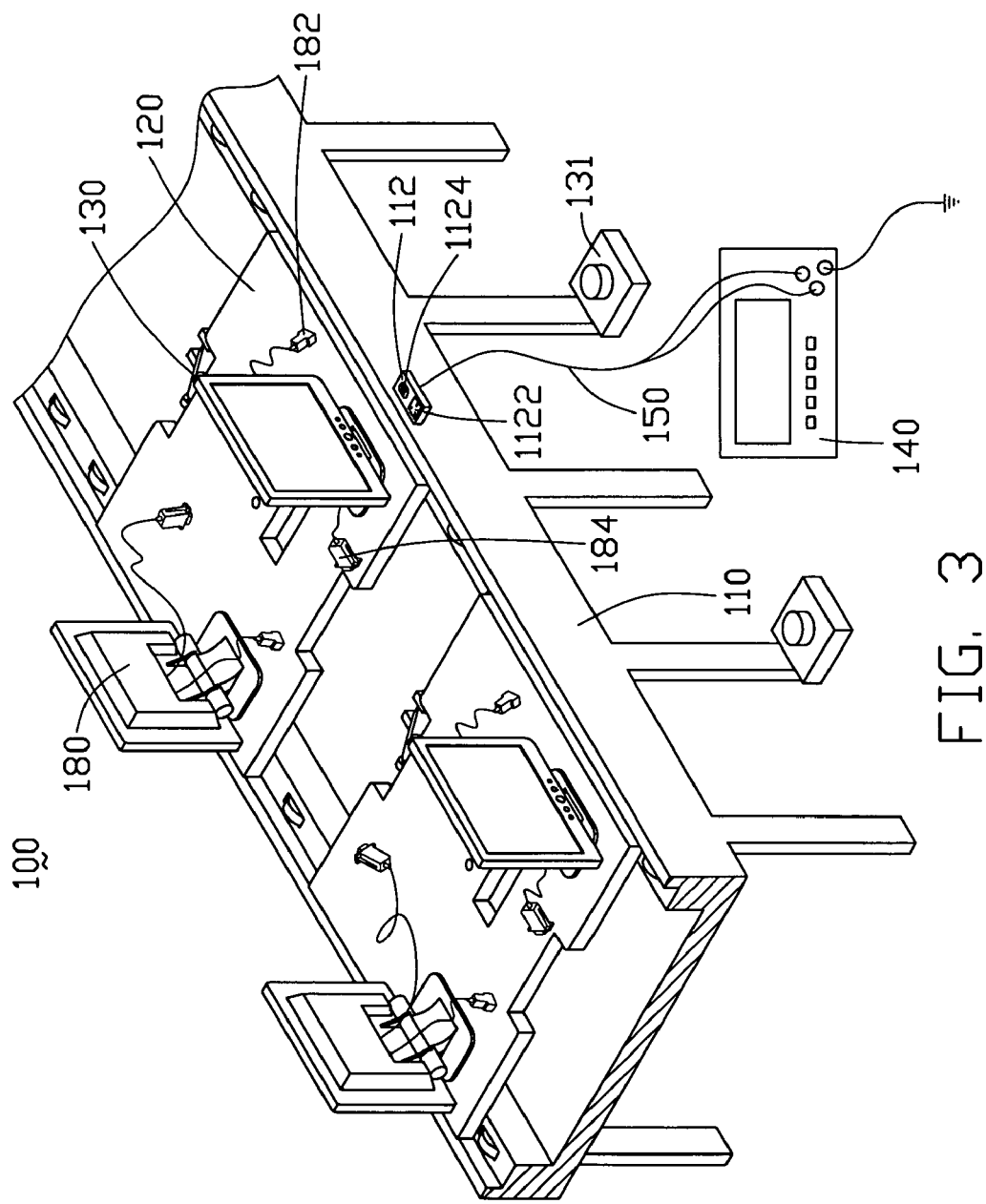
FIG. 3 is an isometric view of part of a conventional testing apparatus, together with four LCDs positioned thereon.

Referring to FIGS. 1 and 2, these illustrate a same part of a testing apparatus 200 according to an exemplary embodiment of the present invention. LCDs 280 to be tested are also shown in FIGS. 1 and 2. However, this is for the purposes of exemplary illustration only, and in general the testing apparatus 200 can be used to test any of various electronic devices, appliances or products. Further, for simplicity, components in respect of only one of two lines of LCDs 280 are shown in FIG. 2. The testing apparatus 200 includes a workbench 210, a plurality of conveyance boards 220, a plurality of test devices 240 (only one shown), a plurality of automatic detection devices 250, a plurality of current connectors 260, a high voltage connector 270, a plurality of tri-colored beepers 230, and a plurality of automatic controllers 290 (only one shown).

The workbench 210 includes a plurality of actuation detection devices 212 (only one shown, in phantom) and a plurality of actuation devices 214. Each actuation device 214 is used to stop or move a corresponding conveyance board 220. Each actuation detection device 212 is positioned ahead of a corresponding actuation device 214 and below the conveyance boards 220, and is used to detect the presence of a conveyance board 220. If a conveyance board 220 is present, the actuation detection device 212 sends a detection signal to a corresponding automatic controller 290. The actuation detection device 212 can, for example, be an optoelectronic detector. The automatic controller 290 can, for example, be a host computer.

Each conveyance board 220 is slidably positioned on the workbench 210, and is used to support a pair of LCDs 280. The conveyance board 220 includes a supporting surface 221 and a lower surface (not labeled). A pair of power outlets 223 and a pair of loading output connectors 226 are provided at the supporting surface 221. Each loading output connector 226 is box-shaped, and has a video signal jack 2261 for connecting with a video signal lead (not labeled) of a corresponding LCD 280. An input current module (not visible) is positioned at the lower surface of the conveyance board 220. The input current module includes three strip-shaped conductive plates (not visible), and is electrically connected with the power outlets 223.

The automatic detection devices 250 are positioned in the vicinity of two opposite sides of the workbench 210, to detect the presence of LCDs 280 on the conveyance boards 220. Each automatic detection device 250 is an infrared detector, and generates a detection signal and sends the detection signal to a corresponding automatic controller 290.

The high voltage connector 270 is positioned under the workbench 210 and the conveyance boards 220. The high voltage connector 270 includes a second pneumatic device 271, a base plate (not labeled), a first conductive strip 273, a second conductive strip 274, and a third conductive strip 275. The first conductive strip 273, the second conductive strip 274 and the third conductive strip 275 are metallic, and are fixed on the base plate. The second pneumatic device 271 is mechanically connected to an underside of the base plate, and electrically connected to the first conductive strip 273, the second conductive strip 274 and the third conductive strip 275. Further, the second pneumatic device 271 is electrically connected with a corresponding automatic controller 290. The automatic controller 290 is used to control the second pneumatic device 271 in response to the detection signals received from the automatic detection devices 250, so that the base plate with the first conductive strip 273, the second conductive strip 274 and the third conductive strip 275 is moved up or down. When the base plate is moved up, the first conductive strip 273, the second conductive strip 274 and the third conductive strip 275 are electrically connected with the three strip-shaped plates on the lower surface of the conveyance board 220.

Each current connector 260 is positioned in the vicinity of a side of the workbench 210 near a corresponding automatic detection device 250. The current connector 260 includes a first pneumatic device 261 and a metallic probe 262. The metallic probe 262 is resilient and retractable, and corresponds with the loading output connector 226 of each conveyance board 220. The first pneumatic device 261 is electrically connected with a corresponding automatic controller 290. The automatic controller 290 is used to control the first pneumatic device 261 in response to the detection signals received from the automatic detection devices 250, so that the metallic probe 262 is moved down or up.

Each test device 240 is positioned near the workbench 210, and includes a high voltage connector 241, a low voltage connector 242, and a ground connector 244. The high voltage connector 241 is electrically connected with the first conductive strip 273 and the second conductive strip 274 of the high voltage connector 270. The low voltage connector 242 is electrically connected with the metallic probe 262 of a corresponding current connector 260. The ground connector 244 is grounded. Further, the third conductive strip 275 of the high voltage connector 270 is grounded.

Each tri-colored beeper 230 is positioned over the workbench 210 and in the vicinity of a corresponding current connector 260. The tri-colored beeper 230 includes a red light, a green light, and a yellow light. The tri-colored beeper 230 is electrically connected with a corresponding automatic controller 290, to indicate to an operator whether an LCD 280 is currently being tested, and whether a just-tested LCD 280 has passed the test or not. If a test of an LCD 280 is under way, the yellow light of the tri-colored beeper 230 is illuminated. If the LCD 280 has passed the test, the green light of the tri-colored beeper 230 is illuminated and the tri-colored beeper 230 beeps. If the LCD 280 has failed the test, the red light of the tri-colored beeper 230 is illuminated and the tri-colored beeper 230 beeps.

Each automatic controller 290 is used to receive signals from a corresponding actuation detection device 212, a corresponding pair of automatic detection devices 250, and a corresponding test device 240, and is used to generate instructions to move a corresponding actuation device 214 up or down. The automatic controller 290 can be electrically connected with or disconnected from a corresponding current connector 260 and the high voltage connector 270.

In an alternative embodiment, the first conductive strip 273, the second conductive strip 274 and the third conductive strip 275 of the high voltage connector 270 can instead be a first array of metallic probes, a second array of metallic probes and a third array of metallic probes. The first, second and third arrays of metallic probes are fixed on the base plate. All the metallic probes can have substantially the same height, whereby the first, second and third arrays of metallic probes are substantially coplanar with each other.

A testing method using the testing apparatus 200 of the present invention is described below. Unless the context indicates otherwise, the description is in relation to FIG. 2, and in relation to one LCD 280 positioned on one conveyance board 220. The testing method includes the steps of:

Step 1: Two LCDs 280 are positioned on the conveyance board 220, and video signal cables (not labeled) and power cables (not labeled) of the LCDs 280 are electrically connected with the video signal jacks 2261 and the power outlets 223 of the conveyance board 220 respectively.

Step 2: The conveyance board 220 moves horizontally along the workbench 210, and when the conveyance board 220 reaches a testing area (not labeled), the actuation detection device 212 generates a detection signal and sends the detection signal to the automatic controller 290. When the automatic controller 290 receives the detection signal, the automatic controller 290 sends an instruction to the actuation device 214 so that the actuation device 214 moves up and stops the conveyance board 220 in position.

Step 3: Two of the automatic detection devices 250 are located in the vicinity of two opposite sides of the workbench 210 at the testing area, to detect the presence of the LCDs 280 on the conveyance board 220. If the automatic detection devices 250 do not detect any LCD 280, the automatic detection devices 250 generate corresponding detection signals and send the detection signals to the automatic controller 290. Then the automatic controller 290 sends an instruction to the actuation device 214 so that the actuation device 214 moves down. Thereby, the conveyance board 220 can continue to move horizontally along the workbench 210 to a next testing area (not labeled).

Conversely, if the automatic detection devices 250 detect at least one of the LCDs 280 on the conveyance board 220, then one or both of the automatic detection devices 250 generates a corresponding detection signal and sends the detection signal to the automatic controller 290.

Step 4: After the automatic controller 290 receives at least one detection signal indicating that at least one of the LCDs 280 is on the conveyance board 220, then the following procedure takes place in respect of each LCD 280. The first pneumatic device 261 of the current connector 260 is moved down, and the second pneumatic device 271 of the high voltage connector 270 is moved up. Thus, the metallic probe 262 of the current connector 260 is electrically connected with the loading output connector 226. Further, the first conductive strip 273, the second conductive strip 274 and the third conductive strip 275 of the high voltage connector 270 are electrically connected with the three strip-shaped conductive plates at the lower surface of the conveyance board 220. Then, a test is performed on the LCD 280 via the high voltage connector 270 and the current connector 260, under control of the automatic controller 290. When the test is completed, a signal indicating a result of the test is sent to the automatic controller 290. Typically, the test performed is a hi-pot test.

Step 5: The automatic controller 290 receives the signal of test result from the actuation detection device 212 and controls the tri-colored beeper 230 accordingly. If the LCD 280 has failed the test, the red light of the tri-colored beeper 230 is illuminated and the tri-colored beeper 230 beeps. The automatic controller 290 also sends an instruction to the first pneumatic device 261 so that the first pneumatic device 261 moves up and the metallic probe 262 disconnects from the loading output connector 226. The automatic controller 290 further sends an instruction to the second pneumatic device 271 so that the second pneumatic device 271 moves down. Thereby, the first conductive strip 273, the second conductive strip 274 and the third conductive strip 275 are disconnected from the three strip-shaped conductive plates at the lower surface of the conveyance board 220. Then, an operator moves the LCD 280 away from the conveyance board 220. After that, the conveyance board 220 can continue to move horizontally along the workbench 210 to the next testing area (not labeled).

If the LCD 280 has passed the test, the green light of the tri-colored beeper 230 is illuminated and the tri-colored beeper 230 beeps. The automatic controller 290 sends an instruction to the first pneumatic device 261 so that the first pneumatic device 261 moves up and the metallic probe 262 disconnects from the loading output connector 226. The automatic controller 290 also sends an instruction to the second pneumatic device 271 so that the second pneumatic device 271 moves down. Thereby, the first conductive strip 273, the second conductive strip 274 and the third conductive strip 275 are disconnected from the three strip-shaped conductive plates at the lower surface of the conveyance board 220. Then the actuation device 214 is moved down so that the conveyance board 220 can continue to move horizontally along the workbench 210 to the next testing area (not labeled).

When the test is performed, the high voltage connector 241 and the ground connector 244 of the test device 240, the first and second conductive strips 273, 274 and third conductive strip 275 of the high voltage connector 270, and each of the LCDs 280 cooperatively form an electrical test loop to enable hi-pot testing to be performed.

While exemplary and preferred embodiments have been described above, it is to be understood that the description is not limited thereto. To the contrary, various modifications and similar arrangements (as would be apparent to those skilled in the art) are intended to be covered by the above description. Therefore, the scope of the appended claims should be accorded the broadest interpretation so as to encompass all such modifications and similar arrangements.

I claim:

1. A testing apparatus, comprising:
   a workbench;
   a conveyance board, slidably positioned on the workbench and configured to support an electronic apparatus to be tested, and comprising a plurality of electrically conductive contact members;
   a test device configured to test the electronic apparatus;
   an automatic detection device configured to detect the presence of the electronic apparatus on the conveyance board and send a corresponding first detection signal;
   a high voltage connector configured to be mechanically and electrically connected with the electrically conductive contact members and mechanically and electrically disconnected from the electrically conductive contact members; and
   an automatic controller, configured for receiving the first detection signal and sending an instruction to the high voltage connector to mechanically and electrically connect with the electrically conductive contact members.

2. The testing apparatus as claimed in claim 1, further comprising a current connector, wherein the conveyance board further comprises a loading output connector, the current connector is configured to be mechanically and electrically connected with the loading output connector and mechanically and electrically disconnected from the loading output connector, and the automatic controller is further configured for sending an instruction to the current connector to mechanically and electrically connect with the loading output connector upon receiving the first detection signal.

3. The testing apparatus as claimed in claim 2, wherein the current connector further comprises a first pneumatic device and a metallic probe which is retractable, and the first pneumatic device is coupled with and moves the metallic probe.

4. The testing apparatus as claimed in claim 3, wherein the first pneumatic device is electrically connected with and controlled by the automatic controller.

5. The testing apparatus as claimed in claim 1, wherein the high voltage connector comprises a first conductive strip, a second conductive strip, and a third conductive strip which are substantially coplanar with each other.

6. The testing apparatus as claimed in claim 5, wherein the high voltage connector further comprises a second pneumatic device which is used to move the first conductive strip, the second conductive strip and the third conductive strip up and down.

7. The testing apparatus as claimed in claim 6, wherein the second pneumatic device is electrically connected with and controlled by the automatic controller.

8. The testing apparatus as claimed in claim 6, wherein the first conductive strip, the second conductive strip and the third conductive strip comprise metallic plates.

9. The testing apparatus as claimed in claim 1, wherein the high voltage connector comprises a first array of metallic probes, a second array of metallic probes and a third array of metallic probes, all of which are substantially coplanar with each other.

10. The testing apparatus as claimed in claim 5, wherein the conveyance board further comprises a power outlet at a supporting surface thereof, and the power outlet is configured for electrical connection to a product to be tested.

11. The testing apparatus as claimed in claim 10, wherein the current connector comprises a metallic probe which is retractable, the conveyance board further comprises a loading output connector at the supporting surface, and the loading output connector corresponds to the metallic probe of the current connector.

12. The testing apparatus as claimed in claim 11, wherein the loading output connector is box-shaped, and has a video signal jack configured for electrical connection to a product to be tested.

13. The testing apparatus as claimed in claim 5, wherein the electrically conductive contact members of the conveyance board are three strip-shaped plates positioned at a lower surface of the conveyance board, and the three strip-shaped plates correspond to the first conductive strip, the second conductive strip and the third conductive strip of the high voltage connector.

14. The testing apparatus as claimed in claim 1, further comprising an actuation device positioned at the workbench, wherein the actuation device is configured to stop or move the conveyance board.

15. The testing apparatus as claimed in claim 14, further comprising an actuation detection device positioned at the workbench, the actuation detection device configured for detecting the presence of the conveyance board and sending a second detection signal to the automatic controller.

16. The testing apparatus as claimed in claim 15, wherein the automatic controller is further configured for receiving the second detection signal from the actuation detection device and sending an instruction to the actuation device to stop the conveyance board.

17. The testing apparatus as claimed in claim 1, further comprising a tri-colored beeper positioned at the workbench and in the vicinity of the current connector, wherein the tri-colored beeper comprises a red light, a green light, and a yellow light.

18. A method for testing a product using a testing apparatus, the testing apparatus comprising a workbench, a conveyance board, a test device, an automatic detection device, a current connector, a high voltage connector, an actuation device, an actuation detection device, and an automatic controller, the method comprising:
   positioning the product on the conveyance board, and connecting a video signal cable and a power cable of the product with a video signal jack and a power outlet of the conveyance board;
   moving the conveyance board along the workbench until the actuation detection device detects the presence of the conveyance board, and generating a first detection signal and sending the first detection signal to the automatic controller;
   moving the actuation device up to stop the conveyance board;
   detecting the presence of the product on the conveyance board by the automatic detection device, and generating a second detection signal and sending the second detection signal to the automatic controller;
   electrically connecting the current connector to the video signal jack of the conveyance board and electrically connecting the high voltage connector with electrically conductive members of the conveyance board that are electrically connected with the power outlet, in order to test the product;
   disconnecting the current connector from the video signal jack and disconnecting the high voltage connector from the electrically conductive members after a test is completed; and
   moving the actuation device down so that the conveyance board can move further along the workbench.

19. The testing method as claimed in claim 18, wherein the testing apparatus further comprises a tri-color beeper, and the testing method further comprises illuminating a red light, a green light or a yellow light of the tri-color beeper according to a status of the test determined by the automatic controller.

20. The testing method as claimed in claim 19, wherein the red light of the tri-colored beeper is illuminated if the product fails the test, the green light of the tri-colored beeper is illuminated if the product passes the test, and the yellow light of the tri-colored beeper is illuminated if the test is under way.

* * * * *